(12) United States Patent
Stettner

(10) Patent No.: US 12,532,700 B2
(45) Date of Patent: Jan. 20, 2026

(54) METHOD FOR DEPOSITING AN EPITAXIAL LAYER ON A SUBSTRATE WAFER

(71) Applicant: Siltronic AG, Munich (DE)

(72) Inventor: Thomas Stettner, Waging am See (DE)

(73) Assignee: SILTRONIC AG, Munich (DE)

( * ) Notice: Subject to any disclaimer, the term of this patent is extended or adjusted under 35 U.S.C. 154(b) by 288 days.

(21) Appl. No.: 18/252,193

(22) PCT Filed: Oct. 27, 2021

(86) PCT No.: PCT/EP2021/079756
§ 371 (c)(1),
(2) Date: May 9, 2023

(87) PCT Pub. No.: WO2022/096332
PCT Pub. Date: May 12, 2022

(65) Prior Publication Data
US 2024/0021449 A1    Jan. 18, 2024

(30) Foreign Application Priority Data
Nov. 9, 2020  (EP) .................................... 20206455

(51) Int. Cl.
*H01L 21/67* (2006.01)
*C30B 25/16* (2006.01)
(Continued)

(52) U.S. Cl.
CPC ........ *H01L 21/67253* (2013.01); *C30B 25/16* (2013.01); *C30B 25/20* (2013.01); *C30B 29/06* (2013.01); *H01L 21/67259* (2013.01)

(58) Field of Classification Search
CPC ....... C30B 23/002; C30B 25/16; C30B 25/20; C30B 29/06; H01L 21/67253; H01L 21/67259; H01L 21/67288
See application file for complete search history.

(56) References Cited

U.S. PATENT DOCUMENTS

2003/0041798 A1* 3/2003 Wenski ................... C30B 25/02
117/84
2007/0227441 A1* 10/2007 Narahara ............ C23C 16/4585
118/715

(Continued)

FOREIGN PATENT DOCUMENTS

DE     102017210423 A1   12/2018
DE     112011103769 B4    2/2019

(Continued)

*Primary Examiner* — Hua Qi
(74) *Attorney, Agent, or Firm* — LEYDIG, VOIT & MAYER, LTD.

(57) ABSTRACT

A characteristic thickness value of an edge of a wafer is determined, including at a notch position. The wafer is placed in a placement area, surrounded by a boundary, of susceptor for depositing an epitaxial layer. The characteristic thickness value at the notch position is checked to see if it differs by more than a percentage limit from the characteristic thickness value at an edge position having the greatest characteristic thickness value. The placing of the substrate wafer on the placement area is executed in such a way that a distance of the wafer from the boundary of the placement area is smaller at the edge position having the greatest characteristic thickness value or at the notch position than at other edge positions.

13 Claims, 5 Drawing Sheets

(51) Int. Cl.
*C30B 25/20* (2006.01)
*C30B 29/06* (2006.01)

(56) References Cited

U.S. PATENT DOCUMENTS

| | | |
|---|---|---|
| 2009/0252942 A1 | 10/2009 | Kanaya et al. |
| 2010/0216261 A1 | 8/2010 | Brenninger et al. |
| 2016/0172254 A1 | 6/2016 | Wimplinger |
| 2017/0117228 A1* | 4/2017 | Schauer .................. C23C 16/24 |
| 2018/0226304 A1 | 8/2018 | Chen et al. |
| 2019/0172739 A1* | 6/2019 | Nakamura ........ H01L 21/67718 |

FOREIGN PATENT DOCUMENTS

| | | | |
|---|---|---|---|
| EP | 0870852 A1 | | 10/1998 |
| JP | 2002043230 A | | 2/2002 |
| JP | 2010034372 A | * | 2/2010 |
| JP | 2012227471 A | | 11/2012 |
| JP | 2015201599 A | | 11/2015 |
| WO | WO 2014103657 A1 | | 7/2014 |
| WO | WO 2017135604 A1 | | 8/2017 |

* cited by examiner

METHOD FOR DEPOSITING AN EPITAXIAL LAYER ON A SUBSTRATE WAFER

CROSS REFERENCE TO RELATED APPLICATIONS

This application is a U.S. National Phase application under 35 U.S.C. § 371 of International Application No. PCT/EP2021/079756, filed on Oct. 27, 2021, and claims benefit to European Patent Application No. EP 20206455.6, filed on Nov. 9, 2020. The International Application was published in German on May 12, 2022 as WO 2022/096332 A1 under PCT Article 21(2).

FIELD

The present disclosure relates to a method for depositing an epitaxial layer on a substrate wafer.

BACKGROUND

Demanding applications in the electronics industry require epitaxially coated semiconductor wafers, particularly substrate wafers made of monocrystalline silicon, that have been epitaxially coated with a layer of silicon.

One frequently used method for depositing the layer is that of vapour deposition. In that case, the material for the layer is provided by process gas, which is passed over the side of the substrate wafer that is to be coated, at temperatures at which a precursor compound comprising the material and present in the process gas undergoes chemical cleavage. The method is carried out generally in an apparatus that is implemented as a single wafer reactor. One such single wafer reactor is described in EP 0 870 852 A1, for example.

During the deposition of the layer, the substrate wafer lies on the placement area of a pocket of a susceptor, being surrounded in the meantime by a boundary of the placement area. A prominent edge position of a semiconductor wafer is the notch position, where an orientation notch marks the orientation of the crystal lattice. US 2017 0 117 228 A1 describes a susceptor wherein the placement area, or the placement area and the outer boundary of the placement area, protrude inwards at the notch position.

So that the epitaxial layer grows as uniformly as possible on the substrate wafer, there is particular interest in having the substrate wafer lying centrically to the outer boundary in the placement area.

US 2010 0 216 261 A1 proposes monitoring the correct position of the substrate wafer on the susceptor via a camera system.

WO17 135 604 A1 describes measuring a characteristic thickness value in the edge region, after the deposition of the epitaxial layer, and changing certain process parameters for subsequent depositions as a function of the measurement result.

WO 14 103 657 A1 and JP2015 201 599 A disclose methods which, starting from the distribution of characteristic thickness values in the edge region of the semiconductor wafer with epitaxially deposited layer, calculate an eccentricity in order to, depending on this eccentricity, correct the position of a subsequent substrate wafer on the susceptor.

US 2009 0 252 942 A1 and JP2002 043 230 A propose measuring the planarity of the substrate wafer prior to the deposition of the epitaxial layer, and changing certain process parameters during deposition in such a way that an edge declension becomes smaller with the coating of the substrate wafer.

However, differences in thickness in the edge region of the epitaxially coated substrate wafer cannot be avoided with this procedure if the substrate wafer itself already has differences in thickness in the edge region.

SUMMARY

In an embodiment, the present disclosure provides a method that deposits an epitaxial layer on a substrate wafer from a gas phase. The method includes: measuring an edge geometry of the substrate wafer, which assigns a characteristic thickness value to an edge of the substrate wafer as a function of edge positions, including a characteristic thickness value at a notch position; placing the substrate wafer on a placement area of a pocket of a susceptor of an apparatus for depositing the epitaxial layer, the placement area being surrounded by an outer boundary; heating the substrate wafer; passing process gas over the substrate wafer; and verifying whether the characteristic thickness value at the notch position differs by more than a percentage limit from the characteristic thickness value at an edge position having the greatest characteristic thickness value. The placing of the substrate wafer on the placement area is executed: in such a way that a distance of the substrate wafer from the outer boundary of the placement area is smaller at the edge position having the greatest characteristic thickness value than at other edge positions, provided that the difference is greater than the percentage limit, or in such a way that the distance of the substrate wafer from the outer boundary of the placement area is smaller at the notch position than at the other edge positions, provided that the difference is not greater than the percentage limit.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
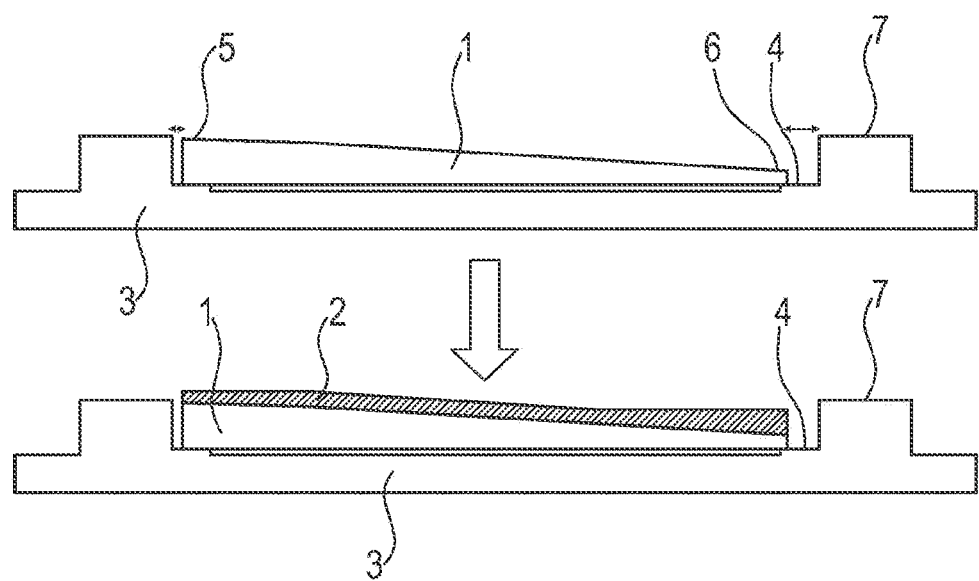
FIG. 1 shows, qualitatively, aspects of the present disclosure.

Aspects of the present disclosure provide a solution to the problem that allows the thickness of the epitaxial layer in the edge region to be made different at different positions of the periphery of the substrate wafer.

An aspect of the present disclosure provides a method for depositing an epitaxial layer on a substrate wafer from a gas phase, the method comprising:

measuring an edge geometry of the substrate wafer, which assigns a characteristic thickness value to an edge of the substrate wafer as a function of edge positions, including the characteristic thickness value at a notch position;

placing the substrate wafer on a placement area of a pocket of a susceptor of an apparatus for depositing the epitaxial layer, the placement area being surrounded by an outer boundary;

heating the substrate wafer; and passing process gas over the substrate wafer; characterized by:

verifying whether the characteristic thickness value at the notch position differs by more than a percentage limit from the characteristic thickness value at an edge position having the greatest characteristic thickness value;

placing the substrate wafer on the placement area in such a way that the distance of the substrate wafer from the outer boundary of the placement area is smaller at the edge position having the greatest characteristic thickness value than at the other edge positions, provided that the difference is greater than the percentage limit, or in such a way that the distance of the substrate wafer from the outer boundary of the placement area is smaller at the notch position than at the other edge positions, provided that the difference is not greater than the percentage limit.

Aspects of the present disclosure are based on the finding that the centred placement of the substrate wafer in the pocket is accompanied by the expectation that the substrate wafer possesses a consistent edge geometry. In practice, however, this is rarely the case, since machining steps such as grinding and polishing are not in position to create a substrate wafer having a completely consistent edge thickness.

The method implemented according to aspects of the present disclosure is in a position to bring consistency to the edge geometry of an epitaxially coated semiconductor wafer by comparison with the uncoated substrate wafer, particularly if the substrate wafer possesses a comparatively low edge thickness in one edge portion and a comparatively high edge thickness in the opposite edge portion. Notwithstanding this, the edge thickness can also be made homogeneous if, for example, there is only one edge portion with comparatively low edge thickness.

The notch position, however, has a particular significance. There, in the course of the deposition of the epitaxial layer, as a consequence of additional deposition of material on the back side of the substrate wafer, a tolerated edge thickness may be slightly exceeded.

First the edge geometry of the substrate wafer is measured, and so it is available in the form of a characteristic thickness value. Preferably an outermost section of edge having a radial length of 1 mm or 2 mm is barred from the measurement as an edge exclusion. The characteristic thickness value is appropriately, in principle, any measurement value which allows a statement to be made as to the relative thickness at two different portions in the edge region of the substrate wafer. A suitable characteristic thickness value, for example, is the ZDD (Z double derivative) of the front side, which describes the curvature of the edge declension and is defined in SEMI standard M68-0720, or the ESFQR (edge site front surface referenced least-square fit range), which quantifies the planarity of sectors (sites) in the edge region and is defined in the SEMI standard M67-0720. The description hereinafter uses ESFQR as the representative characteristic thickness value.

The method, according to an aspect of the present disclosure, provides for the edge geometry of a substrate wafer to be measured before it is coated with an epitaxial layer. After such measurement there is, for example, a map which assigns an ESFQR value to every sector and hence indicates a thickness profile of the substrate wafer along its periphery. Substrate wafers having a wedgelike cross-sectional shape, or those which are thinner at one edge portion than at others, are particularly suitable. An edge portion is an edge region which extends over a distance of up to 50% of the periphery, preferably 7% to 42% of the periphery, in the peripheral direction. A substrate wafer with a wedgelike shape has a thicker edge portion and a thinner edge portion which are opposite one another, thus having the greatest possible distance from one another.

For the deposition chamber, a single wafer reactor, used for the coating of the substrate wafer, a correlation function is drawn up which assigns a characteristic thickness value difference to a displacement vector. The displacement vector indicates the direction and the amount by which the substrate wafer having the thicker edge portion must be placed, offset from the centred position, into the pocket of the susceptor so that when the epitaxial layer is deposited, at the edge position which as a result of the displacement moves closer to the outer boundary of the placement area of the susceptor less material is deposited, in accordance with the assigned characteristic thickness value difference, than in the opposite edge portion. Accordingly, the characteristic thickness value after the deposition of the epitaxial layer is greater in the thinner edge portion of the substrate wafer by the characteristic thickness value difference than it would be if the substrate wafer, in the course of the deposition of the epitaxial layer, were to be centred in its position in the pocket of the susceptor, and is lower by the characteristic thickness value difference at the edge position which as a result of the displacement moves closer to the outer boundary of the placement area of the susceptor. The displacement vector therefore represents an eccentricity of the position of the centre point of the substrate wafer lying on the susceptor, in comparison to the position which the centre point would have if the substrate wafer were centred in its position in the pocket of the susceptor. The correlation function is determined prior to the coating of the substrate wafer, by means of experiments, by ascertaining which eccentricity results in which change in the characteristic thickness value.

Owing to the special status of the notch position, verification is carried out to determine whether the characteristic thickness value at the notch position of the substrate wafer differs by more than a percentage limit from the characteristic thickness value at the edge position having the greatest characteristic thickness value. The percentage limit is pre-determined and amounts preferably to 10% of the characteristic thickness value at the edge position having the greatest characteristic thickness value.

If the notch position itself is the edge position having the greatest characteristic thickness value, the substrate wafer is placed on the placement area in such a way that the distance of the substrate wafer from the outer boundary of the placement area is smaller at the notch position than at the other edge positions.

If the characteristic thickness value at the notch position differs by more than the percentage limit from the characteristic thickness value at the edge position having the greatest characteristic thickness value, the substrate wafer is placed in the pocket of the susceptor in such a way that the distance of the substrate wafer at the edge position having the greatest characteristic thickness value from the outer boundary of the placement area is smaller than at the other edge positions and smaller than if the substrate wafer were centred in its position in the pocket. The distance is shortened by a displacement vector which is associated with a characteristic thickness value difference, and consequently there is an intended reduced deposition of material at the edge position of greatest characteristic thickness value during the deposition of the epitaxial layer.

If the characteristic thickness value at the notch position differs by not more than the percentage limit from the characteristic thickness value at the edge position having the greatest characteristic thickness value, the substrate wafer is placed in the pocket of the susceptor in such a way that the distance of the substrate wafer from the outer boundary of the placement area is smaller at the notch position than at the other edge positions, and is smaller than if the substrate wafer were to be centred in its position in the pocket. The distance is shortened by a displacement vector which is associated with a characteristic thickness value difference, and consequently there is an intended reduced deposition of material at the notch position during the deposition of the epitaxial layer.

The substrate wafer is placed in the pocket of the susceptor expediently by a robot, which carries out this operation in accordance with the correlation function. Alternatively or additionally, the robot may be configured as a self-learning system, which uses the measured geometry data of the substrate wafers and of the resulting epitaxially coated semiconductor wafers to ascertain and implement the necessary eccentricity for the coating of subsequent substrate wafers. It is preferred, furthermore, for the deposition of the substrate wafer on the susceptor and the position thereof in the pocket of the susceptor to be monitored via a camera system.

The outer boundary of the placement area has a circular or almost circular periphery. The susceptor preferably has a placement area which protrudes inwards at the notch position, more preferably in combination with an outer boundary of the placement area that protrudes inwards at the notch position, in the manner, for example, which is described in US 2017 0 117 228 A1. If the substrate wafer at the notch position, during the deposition of the epitaxial layer, is closer to the edge of the outer boundary of the deposition area, the presence of the inwardly protruding deposition area additionally hinders coating of the back side at the notch position.

The substrate wafer and the epitaxial layer deposited thereon preferably consist substantially of semiconductor material, for example of monocrystalline silicon. The substrate wafer preferably has a diameter of at least 200 mm, more preferably at least 300 mm. The epitaxial layer preferably has a thickness of 1 µm to 20 µm.

FIG. 1 shows in section (vertical section) a substrate wafer 1 deposited in the pocket of a susceptor 3, the wafer 1 having an edge portion 5 which is comparatively thick and an opposite edge portion 6 which is comparatively thin. The substrate wafer 1 is not centred in its position on the placement area 4 of the pocket, but is instead eccentric, specifically such that the thicker edge portion 5 is at less of a distance from an outer boundary 7 of the placement area 4 than is the thinner edge portion 6. As a consequence of this configuration, the rate of growth of material during the deposition of the epitaxial layer is lower where the distance is smaller than where the distance is larger.

The lower part of FIG. 1 shows the situation after the deposition of the epitaxial layer 2. The substrate wafer 1 has become a substrate wafer with deposited epitaxial layer, and the epitaxial layer 2 is thinner in the region of the edge portion having less of a distance from the outer boundary 7 than in the region of the edge portion having a greater distance from the outer boundary 7. Looking at the thickness of the substrate wafer with deposited epitaxial layer 2, and comparing it with the thickness of the substrate wafer 1, it is found that the thickness of the epitaxially coated substrate wafer is more uniform in its edge region than the thickness of the substrate wafer 1. The differences in thickness in the edge region are more pronounced in the case of the substrate wafer 1 than in the case of the epitaxially coated substrate wafer.

Figure 2:
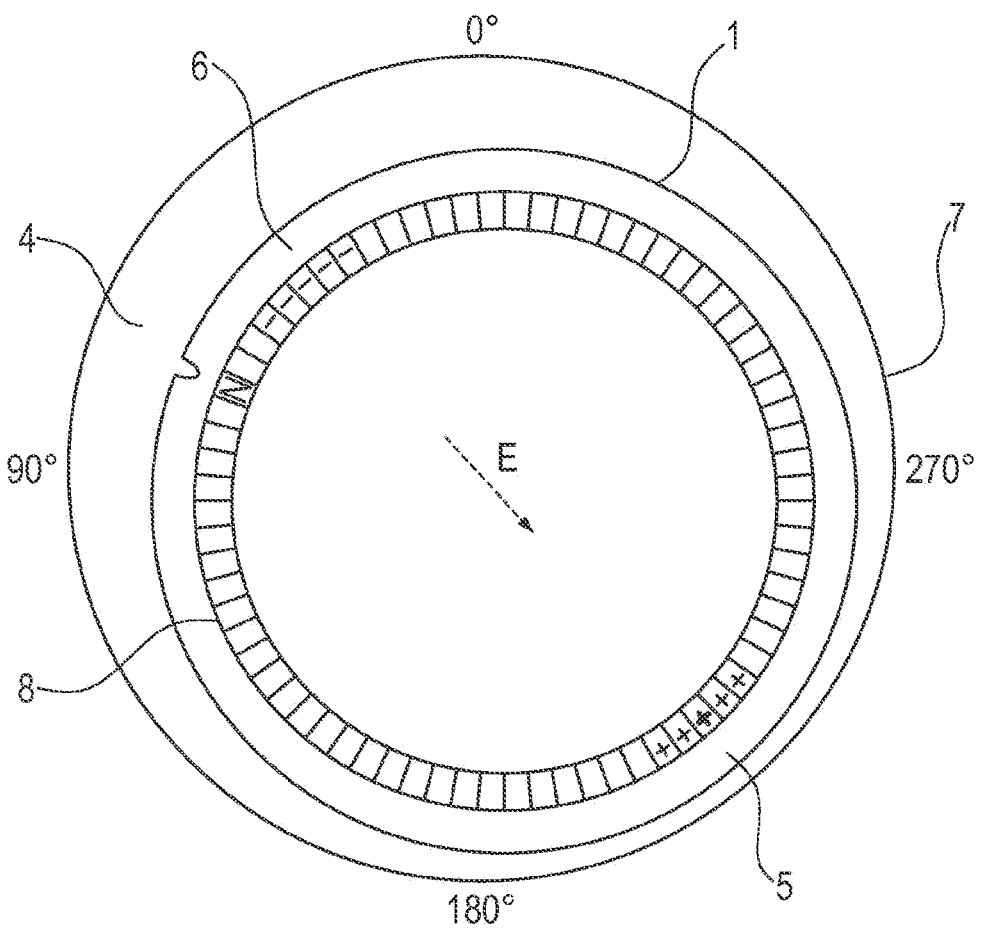
FIG. 2 shows a substrate wafer deposited in the pocket of the susceptor, in one embodiment of the present disclosure.

FIG. 2 shows in plan view a substrate wafer deposited in accordance with aspects of the present disclosure in the pocket of the susceptor. The substrate wafer 1 is not centric in its position in the pocket of the susceptor. The centre point of the substrate wafer is shifted, in accordance with the eccentricity E, from the centre point of the pocket, specifically such that the edge position having the greatest characteristic thickness value is at the smallest distance from the outer boundary 7 of the placement area 4. The direction and amount of the eccentricity E are dependent on a measurement of the edge geometry of the substrate wafer; for example, by measuring the planarity in the form of the ESFQR value in edge segments 5° wide. The result of the measurement is indicated qualitatively by the drawn-in map 8, and shows the thicker edge portion 5, highlighted by "+" symbols, and the thinner edge portion 6, highlighted by "–" symbols. The edge position having the greatest characteristic thickness value is denoted by bold type. The length of the eccentricity E is not shown true to scale. In accordance with the present disclosure, the eccentricity E points to the edge position having the greatest characteristic thickness value, provided that the characteristic thickness value at the notch position differs from the characteristic thickness value at the edge position having the greatest characteristic thickness value in such a way that the difference is greater than a percentage limit.

Figure 3:
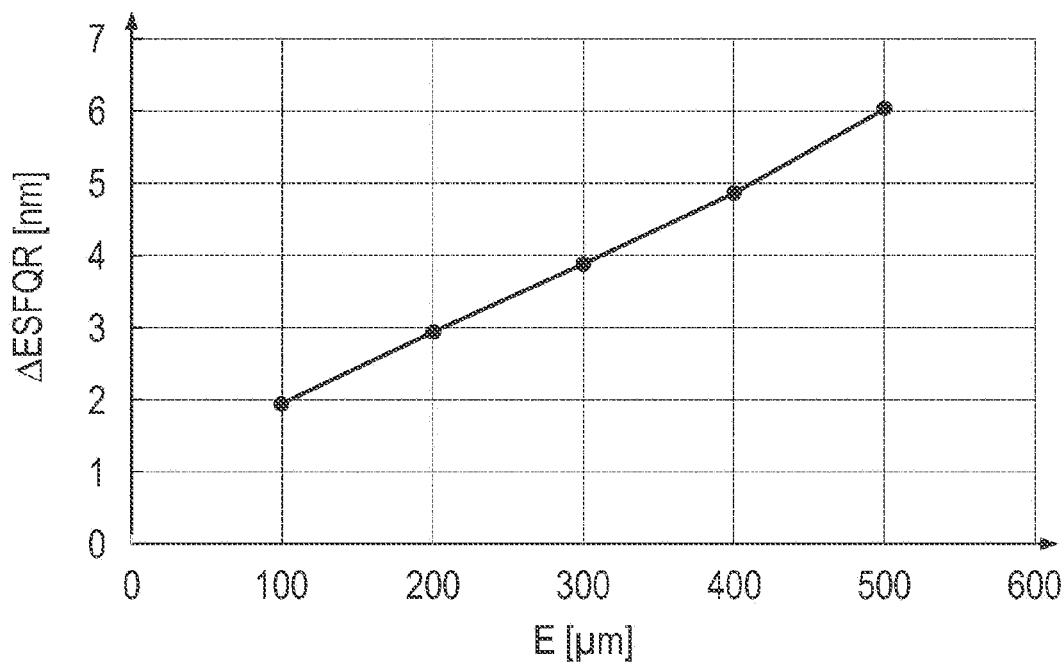
FIG. 3 shows a correlation function which assigns an anticipated change in a characteristic thickness value to an eccentricity.

The selected eccentricity E is based on a correlation function which is determined by preliminary tests for the deposition apparatus employed. These tests study what change in the characteristic thickness value is likely if the substrate wafer is deposited with a defined eccentricity E in the pocket of the susceptor. In the example selected, the correlation function indicates in accordance with FIG. 3 the difference ΔESFQR in the ESFQR value obtained in the thinner edge portion after deposition if the substrate wafer prior to the deposition is deposited in the pocket of the susceptor not centrically, but instead with the corresponding eccentricity E. The correlation function in accordance with FIG. 3, therefore, suggests that after the deposition of the epitaxial layer, the ESFQR value in the sectors of the thinner edge portion will be greater by about 2 nm, provided that the substrate wafer prior to deposition was deposited not centrically, but instead with an eccentricity of 100 µm, in the pocket of the susceptor. In the thicker edge portion, a correspondingly smaller ESFQR value is anticipated.

Figure 4:
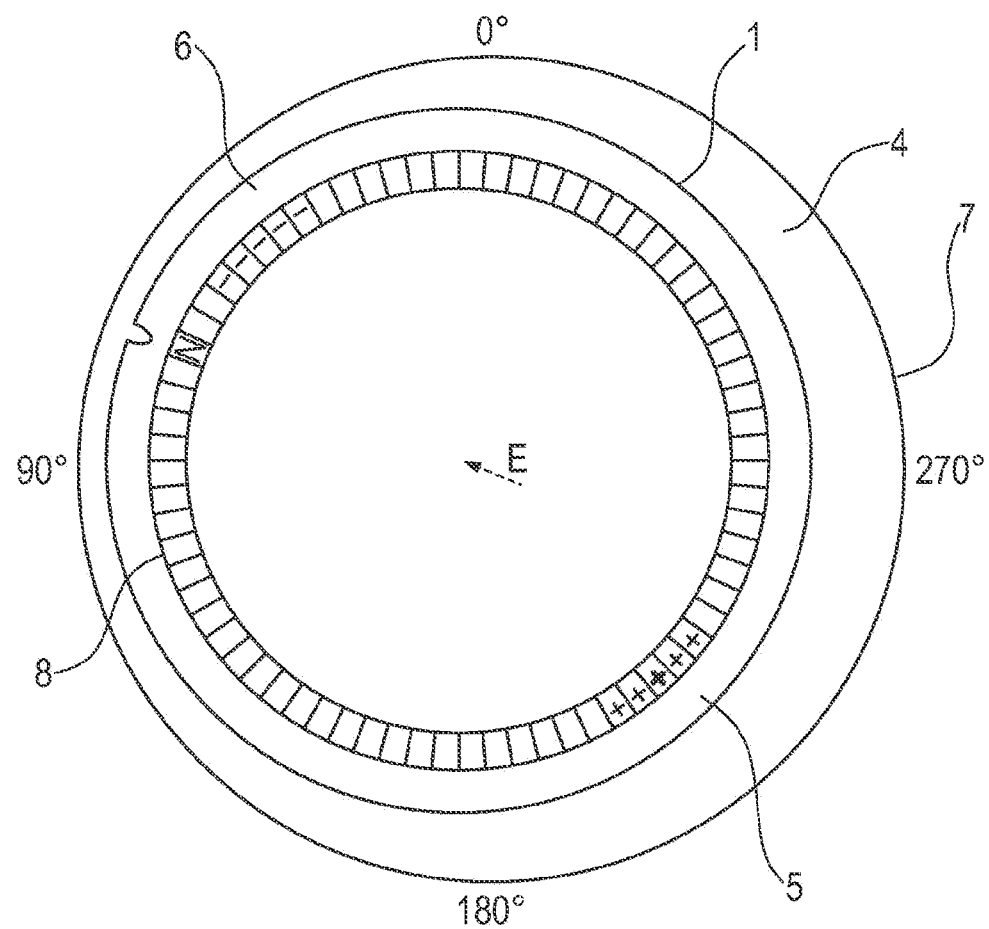
FIG. 4 shows a substrate wafer deposited in the pocket of the susceptor, according to another embodiment of the present disclosure.

FIG. 4 shows the situation if the characteristic thickness value at the notch position differs from the characteristic thickness value at the edge position having the greatest characteristic thickness value in such a way that the difference is not greater than the percentage limit. In this case, the eccentricity E points not to the edge position having the greatest characteristic thickness value, but instead to the notch position N.

Figure 5:
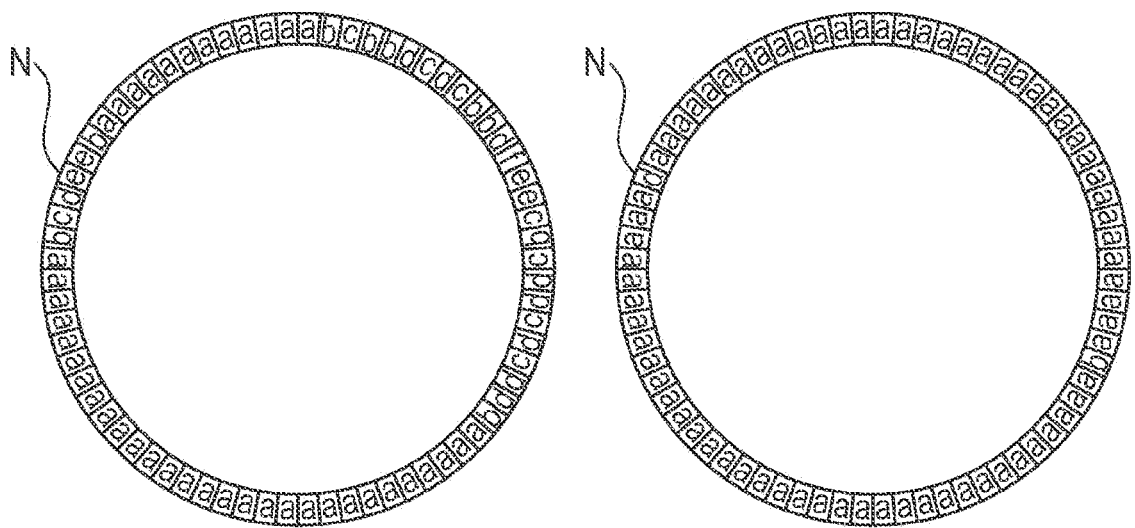
FIG. 5 shows the effect of the embodiment of FIG. 4 in an example.

FIG. 5 shows the effect of the embodiment according to FIG. 4 in an example. The figure depicts the result of the measurement of the characteristic thickness values of a substrate wafer made of monocrystalline silicon having a diameter of 300 mm before the deposition of an epitaxial layer of monocrystalline silicon (left-hand diagram) and of the epitaxially coated substrate wafer (right-hand diagram). The edge geometry is encoded in categories of ESFQR values, from category a to category f, where the edge position with category f denotes the edge position having the greatest characteristic thickness value. Verification of the measurement results reveals that the characteristic thickness value at the notch position with category e differs comparatively slightly from the characteristic thickness value of the edge position having the greatest characteristic thickness value, namely of category f. The difference was lower than the mandated limit, and accordingly the substrate wafer for the deposition of the epitaxial layer was placed onto the placement area of the susceptor in such a way that the distance of the substrate wafer from the outer boundary of the placement area was smaller at the notch position than at the other edge positions. As shown by the left-hand diagram, the characteristic thickness value at the notch position improved to category d without detriment to the other edge positions.

The above description of illustrative embodiments should be understood as being exemplary in nature. The disclosure made therewith enables the skilled person on the one hand to understand the present invention and its attendant advantages, and on the other hand, within the understanding of the skilled person, also embraces obvious modifications and alterations of the structures and methods described. It is therefore intended that the scope of protection of the claims covers all such modifications and alterations, and also equivalents.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SYMBOLS USED 1 substrate wafer
2 epitaxial layer
3 susceptor
4 placement area
5 thick edge portion of the substrate wafer
6 thin edge portion of the substrate wafer
7 outer boundary of the placement area
8 map
E Eccentricity
ΔESFQR difference between ESFQR value and target value
N Notch position

The invention claimed is:

1. A method for depositing an epitaxial layer on a substrate wafer from a gas phase, the method comprising:
   measuring an edge geometry of the substrate wafer, which assigns a characteristic thickness value to an edge of the substrate wafer as a function of edge positions, including a characteristic thickness value at a notch position;
   placing the substrate wafer on a placement area of a pocket of a susceptor of an apparatus for depositing the epitaxial layer, the placement area being surrounded by an outer boundary;
   heating the substrate wafer;
   passing process gas over the substrate wafer; and
   verifying whether the characteristic thickness value at the notch position differs by more than a percentage limit from the characteristic thickness value at an edge position having the greatest characteristic thickness value;
   wherein the placing of the substrate wafer on the placement area is executed:
      in such a way that a distance of the substrate wafer from the outer boundary of the placement area is smaller at the edge position having the greatest characteristic thickness value than at other edge positions, provided that the difference is greater than the percentage limit, or
      in such a way that the distance of the substrate wafer from the outer boundary of the placement area is smaller at the notch position than at the other edge positions, provided that the difference is not greater than the percentage limit.

2. The method according to claim 1, wherein the characteristic thickness value is determined by measuring of an edge site front surface referenced least-square fit range (ESFQR) or a Z double derivative (ZDD).

3. The method according to claim 1, wherein the placing of the substrate wafer is executed via a robot.

4. The method according to claim 1, wherein the method further comprises monitoring a position of the substrate wafer in the pocket with a camera system.

5. The method according to claim 1, the method further comprising depositing the epitaxial layer of silicon on the substrate wafer made of monocrystalline silicon.

6. The method of claim 1, wherein the placing of the substrate wafer on the placement area is executed in such a way that the distance of the substrate wafer from the outer boundary of the placement area is smaller at the edge position having the greatest characteristic thickness value than at the other edge positions, provided that the difference is greater than the percentage limit.

7. The method of claim 1, wherein the placing of the substrate wafer on the placement area is executed in such a way that the distance of the substrate wafer from the outer boundary of the placement area is smaller at the notch position than at the other edge positions, provided that the difference is not greater than the percentage limit.

8. The method of claim 1, wherein the measuring of the edge geometry of the substrate wafer excludes an outermost section of the edge of the substrate having a radial length of 1 mm or 2 mm from the measurement.

9. The method of claim 1, wherein the characteristic thickness value corresponds to a relative thickness of two different portions in an edge region of the substrate wafer.

10. The method of claim 1, wherein the measuring of the edge geometry is completed prior to placing the substrate wafer on the placement area and prior to passing the process gas over the substrate wafer.

11. The method of claim 1, wherein the characteristic thickness value of the edge of the substrate as the function of the edge positions indicates a thickness profile of the substrate wafer along its periphery.

12. The method of claim 1, wherein the placing of the substrate wafer comprises:
   determining a correlation function that assigns a characteristic difference value to a displacement vector, the characteristic difference value corresponding to a difference of the characteristic thickness value at the notch position to the greatest characteristic thickness value, and the displacement vector indicating a direction an amount by which the substrate wafer is placed to offset from a centred position; and
   placing the substrate wafer in the pocket according to the displacement vector.

13. The method of claim 1, wherein the placing of the substrate wafer comprises:
   controlling a robot with a self-learning system, which uses previously measured edge geometries of other substrate wafers and resulting epitaxially coated semiconductor wafers to ascertain an eccentricity of a position of a centre point of the substrate wafer in the pocket based on the measured edge geometry, to position the substrate wafer at the ascertained position.

* * * * *